(12) United States Patent
Tran et al.

(10) Patent No.: US 6,965,251 B1
(45) Date of Patent: Nov. 15, 2005

(54) INPUT BUFFER WITH HYSTERESIS OPTION

(75) Inventors: Neil Nghia Tran, Milpitas, CA (US); Nima Gilanpour, Mountain View, CA (US); Myron W. Wong, Fremont, CA (US); Weiying Ding, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 21 days.

(21) Appl. No.: 10/708,243

(22) Filed: Feb. 18, 2004

(51) Int. Cl.[7] .......................................... H03K 19/003
(52) U.S. Cl. ............................ 326/33; 326/81; 326/83; 327/205
(58) Field of Search ............................. 326/26, 27, 33, 326/63–83; 327/205, 206, 208

(56) References Cited

U.S. PATENT DOCUMENTS

| | | | |
|---|---|---|---|
| 4,539,489 A | 9/1985 | Vaughn | |
| 4,563,594 A | 1/1986 | Koyama | |
| 4,563,595 A | 1/1986 | Bose | |
| 4,703,201 A | 10/1987 | McGrail | |
| 4,719,367 A | 1/1988 | Denda | |
| 4,783,607 A | 11/1988 | Hsieh | |
| 4,786,825 A | 11/1988 | O'Shaughnessy et al. | |
| 4,859,873 A | 8/1989 | O'Shaughnessy et al. | |
| 4,883,975 A | 11/1989 | Enomoto et al. | |
| 5,144,167 A | 9/1992 | McClintock | |
| 5,264,740 A * | 11/1993 | Wright | 327/63 |
| 5,327,020 A | 7/1994 | Ikeda | |
| 5,359,243 A | 10/1994 | Norman | |
| RE34,808 E | 12/1994 | Hsieh | |
| 5,438,292 A | 8/1995 | Tadokoro | |
| 5,489,866 A | 2/1996 | Diba | |
| 5,874,844 A | 2/1999 | Shin | |
| 5,886,556 A | 3/1999 | Ganger et al. | |
| 5,945,859 A | 8/1999 | Pang | |
| 6,060,925 A | 5/2000 | Chou | |
| 6,091,264 A | 7/2000 | Kirsch et al. | |
| 6,124,733 A * | 9/2000 | Sharpe-Geisler | 326/83 |
| 6,163,166 A | 12/2000 | Bielby et al. | |
| 6,335,649 B1 | 1/2002 | Maeda | |
| 6,340,907 B2 | 1/2002 | Aoki | |
| 6,351,173 B1 * | 2/2002 | Ovens et al. | 327/333 |
| 6,433,602 B1 | 8/2002 | Lall et al. | |
| 6,566,932 B2 * | 5/2003 | Yoon | 327/333 |
| 6,586,974 B1 * | 7/2003 | Humphrey et al. | 327/108 |
| 6,624,678 B1 | 9/2003 | Boutaud et al. | |
| 6,657,458 B1 * | 12/2003 | Sharpe-Geisler | 326/41 |

* cited by examiner

*Primary Examiner*—Vibol Tan
(74) *Attorney, Agent, or Firm*—Townsend and Townsend and Crew LLP

(57) ABSTRACT

The invention provides a high-speed buffer that may used at the input of an integrated circuit, such as an input buffer. This buffer may be configured for use as a standard buffer with a single switching threshold, such as a TTL-to-CMOS buffer, or used as a Schmitt trigger with hysteresis, which as at least two switching thresholds. The integrated circuit may be a programmable logic device (PLD) or field programmable gate array (FPGA), but in other embodiments, the integrated circuit may be other types of devices such a microprocessors, ASICs, or memories.

17 Claims, 4 Drawing Sheets

INPUT BUFFER WITH HYSTERESIS OPTION

BACKGROUND OF INVENTION

This invention relates generally to integrated circuits. More specifically, this invention relates to a programmable logic device with buffers that may be selectively configured for Schmitt-triggered or threshold-triggered operation.

Buffer circuits are one of the building blocks of a digital system. A typical integrated circuit has many numbers of buffers. A typical buffer, such as an inverter, noninverting buffer, input buffer, or output buffer, detects a level change at its input based on a fixed switching threshold. For an input signal above this threshold level, the output will be at a particular logic level (e.g., logic 0). For an input signal below this threshold, the output will be at the other logic level (e.g., logic 1).

Digital systems often operate under noisy conditions. Noisy conditions are usually defined as environments where there are signals unrelated to the signal of interest. In some cases, the noise content can be so large that false switching occurs. That is, noise can cause a metastable environment in which a digital low signal appears as a digital high signal, or vice versa.

An approach to eliminating or reducing the effects of noise in a digital system is to employ logic that relies upon a hysteresis detection scheme, instead of a fixed threshold detection scheme. In electronics, hysteresis refers to the property of a device to output a "high" value at an input voltage is higher than the input voltage at which it outputs a "low" value. A Schmitt trigger is an inverter circuit with hysteresis. Schmitt-trigger circuits are particularly useful for providing a smooth reliable output from a circuit that may have some noise on the input. This ability to smooth-out noise is increasingly important for integrated circuits, especially as supply voltage levels are dropping, which generally decreases input noise margins.

Schmitt trigger circuits generally have a progagation delay that is greater than a similar sized buffer circuit without hysteresis. Therefore, in situations where higher performance (i.e., a faster speed path), it would be advantageous to use a threshold-triggered buffer over a Schmitt trigger circuit.

Therefore, it would be highly desirable to improve the noise immunity of selected buffers in a programmable logic device by utilizing Schmitt-trigger technology, while simultaneously exploiting threshold-triggered buffers at circuit nodes in programmable logic devices that have certain critical timing requirements.

SUMMARY OF INVENTION

The invention provides a high-speed buffer that may used at the input of an integrated circuit, such as an input buffer. This buffer may be configured for use as a standard buffer with a single switching threshold, such as a TTL-to-CMOS buffer, or used as a Schmitt trigger with hysteresis, which as at least two switching thresholds. The integrated circuit may be a programmable logic device (PLD) or field programmable gate array (FPGA), but in other embodiments, the integrated circuit may be other types of devices such a microprocessors, ASICs, or memories.

As a Schmitt trigger with hysteresis, there will be two switching thresholds. One switch threshold is used for a low-to-high input signal and another switch threshold is used for a high-to-low input. Schmitt trigger operation will provide greater noise margins than during standard buffer operation.

The circuit of the invention provides higher performance, reducing a propagation delay of the circuit, because some of the same devices used to facilitate Schmitt trigger operation also are used during switching for the standard buffer. This improves the speed of the device.

The buffer may have two inversions: a high at the input will mean the output will be high, and a low at the input will mean the output will be low. However, in other implementations, the buffer may have any number of inversions more or less than two. For example, the buffer may have a single inversion, or may have three, four, five, six, or more inversions. There may be an odd number of inversions, which means a high at the input will mean the output will be low, and a low at the input will mean the output will be high.

In a specific embodiment, the invention includes a first transistor, connected between a first node and a first supply voltage, and the first transistor has a control electrode connected to an input node of the circuit. A second transistor is connected between a second supply voltage and the first node. A third transistor is connected between a second node and the first supply voltage, and the third transistor has a control electrode connected to the input node of the circuit. A fourth transistor is connected between the second supply voltage and the second node, and has a control electrode connected to the input node of the circuit. A fifth transistor is connected between a third node and the first supply voltage, and has a control electrode connected to the second node. A sixth transistor is connected between the second supply voltage and the third node, and has a control electrode connected to the first node, where the third node is connected to a control electrode of the second transistor. A seventh transistor is connected between a fourth node and the first node, and has a control electrode coupled to the third node.

In an implementation, the transistors are metal oxide semiconductor (MOS) transistors, with both NMOS and PMOS type transistors. The control electrode would be a gate electrode and other electrodes would be the drain and the source.

In another embodiment, the invention is a method of operating a programmable logic integrated circuit including providing an input buffer capable of operating as a standard buffer in a first mode or a Schmitt trigger in a second mode, and configuring a mode bit to control whether the input buffer operates in the first mode or the second mode. When in the first mode, a transistor will connect a supply voltage to a first node of the input buffer depending on a input signal to the input buffer. When in the second mode, a transistor will connect the supply voltage to the first node of the input buffer depending on the input signal to the input buffer and an output signal of the input buffer.

Other objects, features, and advantages of the present invention will become apparent upon consideration of the following detailed description and the accompanying drawings, in which like reference designations represent like features throughout the figures.

DETAILED DESCRIPTION

Figure 1:
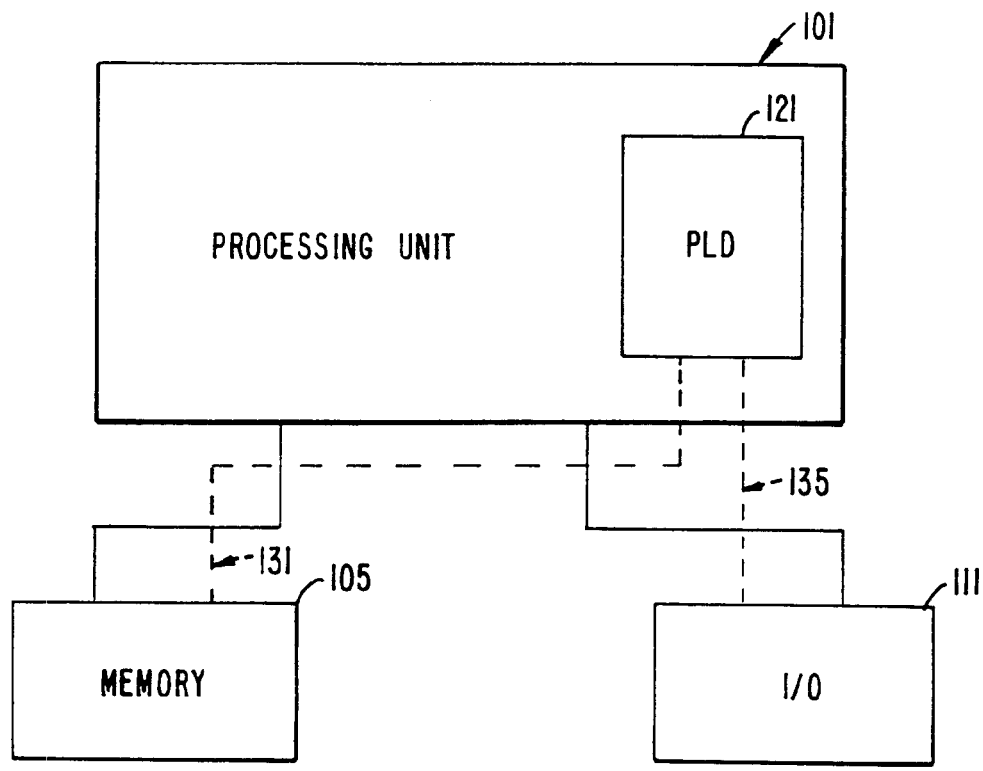
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. Examples of current programmable logic devices are represented by Altera's Classic, MAX®, FLEX®, APEX™, and STRATIX™ series of PLDs. These are described in, for example, U.S. Pat. Nos. 4,617,479, 4,871,930, 5,241,224, 5,258,668, 5,260,610, 5,260,611, 5,436,575, and the Altera Data Book (2003). Programmable logic integrated circuits and their operation are well known to those of skill in the art.

In the particular embodiment of FIG. 1, a processing unit 101 is connected to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, wireless devices, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a re-configurable processor, which can be reprogrammed as needed to handle a particular computing task.

Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
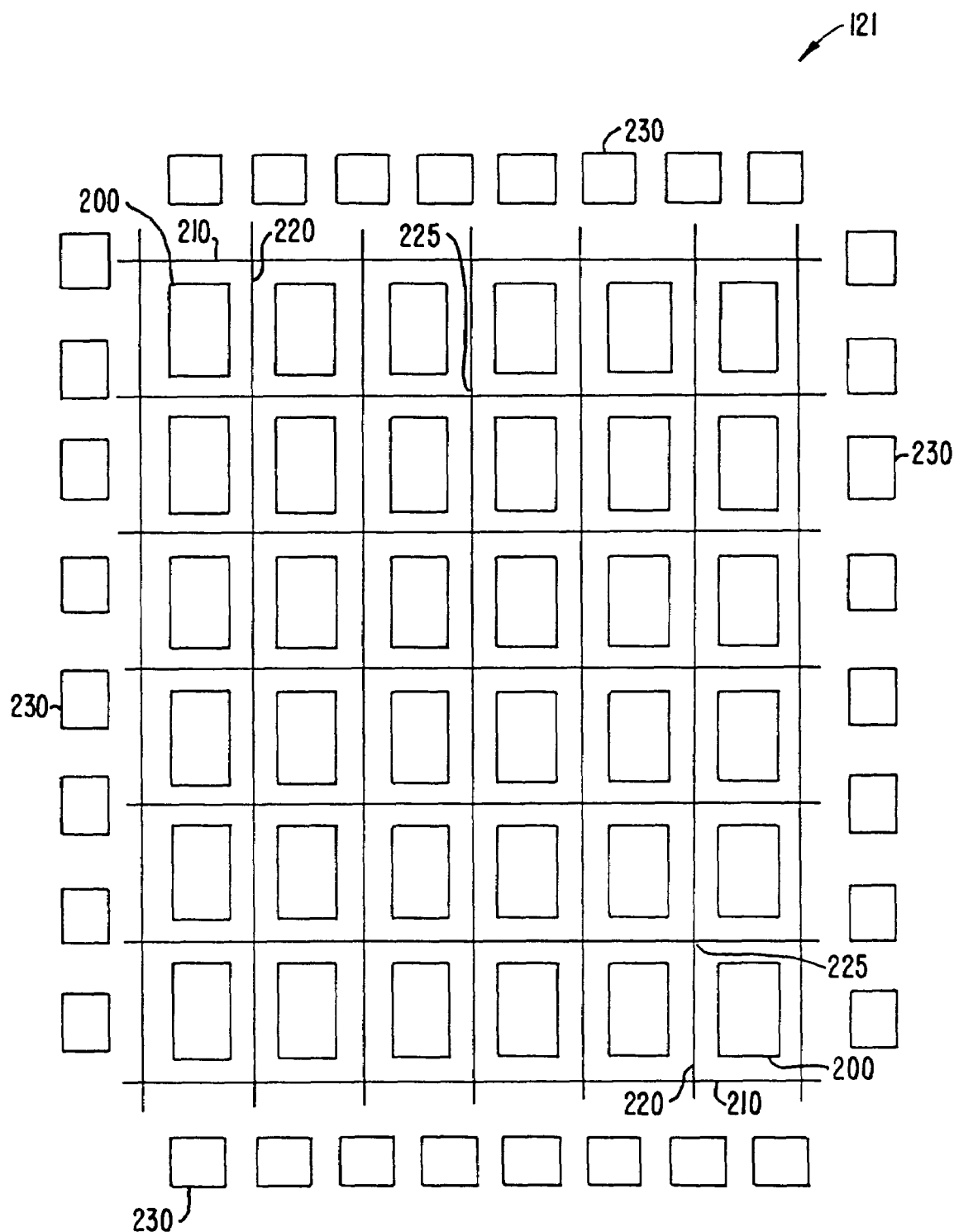
FIG. 2 is a diagram showing an architecture of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output or I/O circuits 230. Input and output circuits 230 are for interfacing the PLD to external, off-chip circuitry. Some or all of these input and output circuits 230 may be consistent with embodiments of the present invention. FIG. 2 shows thirtytwo input and output circuits 230; however, a programmable logic integrated circuit may contain any number of input and output circuits, more or less than the number depicted. As discussed above, some of these in-put-output or I/O drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
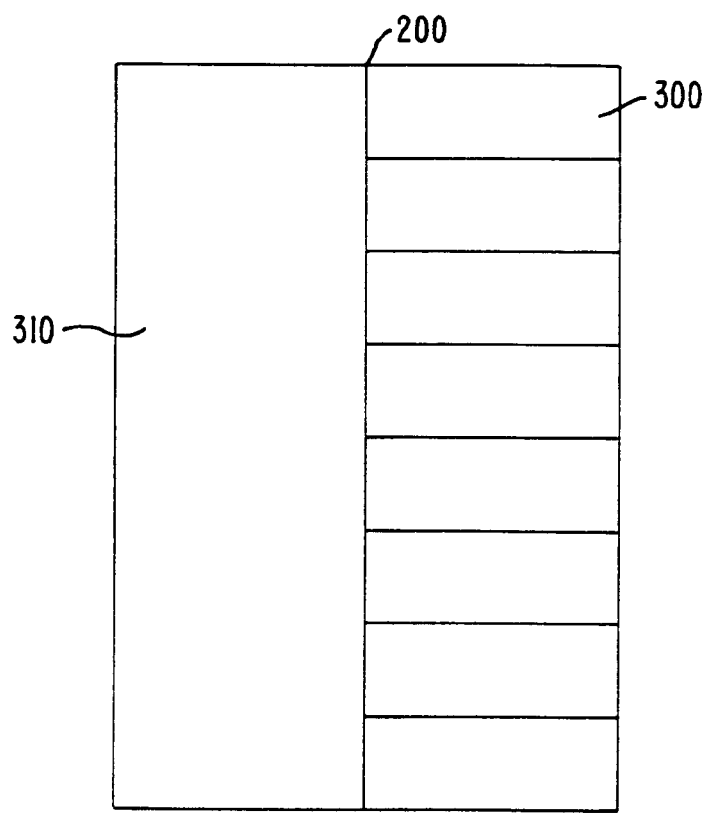
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
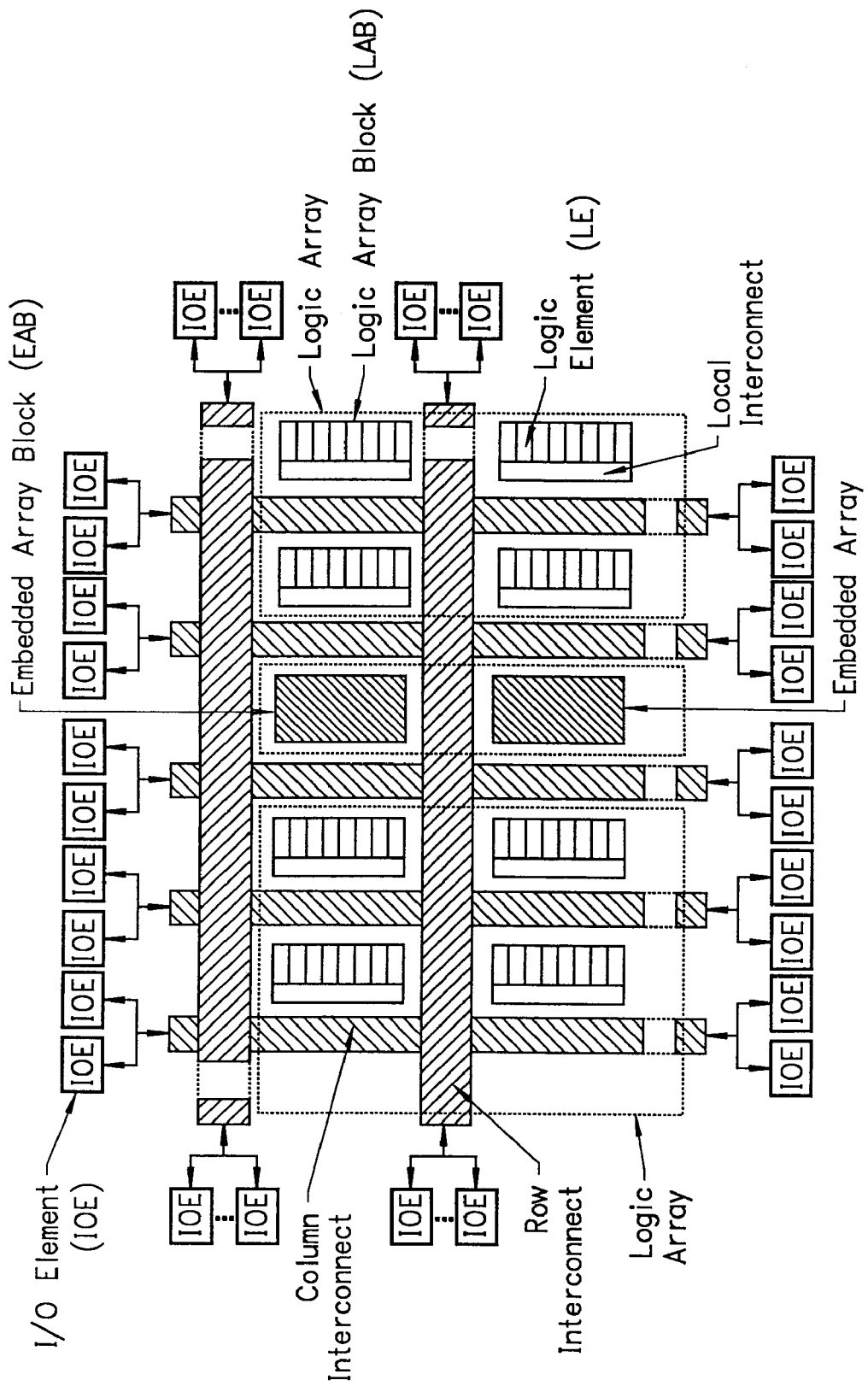
FIG. 4 shows an architecture of a programmable logic integrated circuit with embedded array blocks (EABs).

FIG. 4 shows a programmable logic architecture. The architecture in FIG. 4 further includes (small) embedded array blocks (EABs). EABs contain user memory, a flexible block of RAM. More discussion of this architecture may be found in the Altera Data Book (2003) in the description of the FLEX 10K product family and also in U.S. Pat. No. 5,550,782. Some or all of the input-output or I/O elements may be consistent with embodiments of the present invention. The embedded array blocks can be configured as FIFOs acting as frequency translators and serial to parallel converters for interfacing between high-speed input and outputs and the core circuits including the logic array blocks. Other architectures such as Altera's APEX™ and STRATIX™ family of products are described in detail in the their respective data sheets, available via the Internet at www.altera.com.

Figure 5:
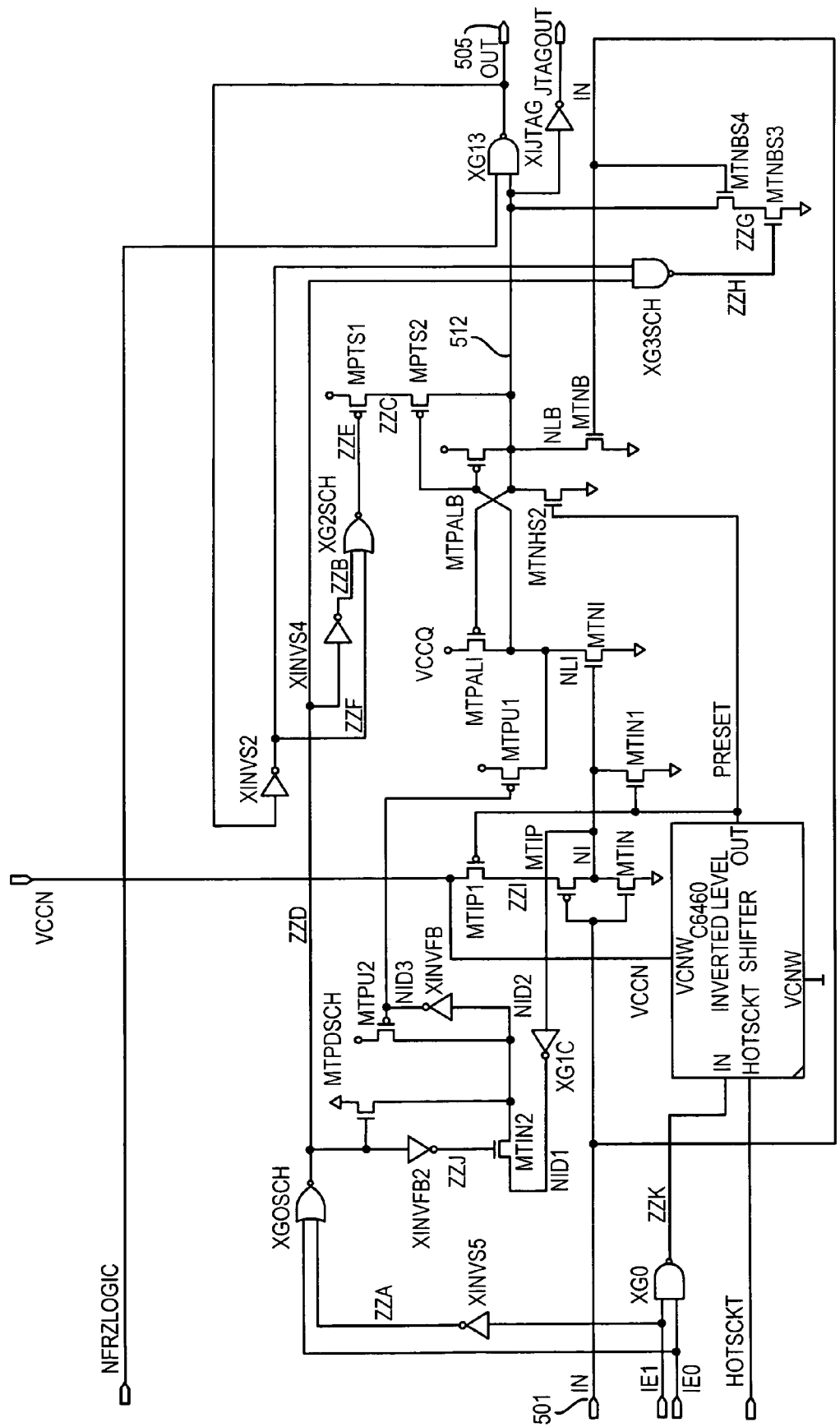
FIG. 5 shows an input buffer circuit with hysteresis option.

FIG. 5 shows a circuit diagram of an input buffer with a Schmitt trigger or hysteresis option. This input buffer may be used as a standalone input buffer for the integrated circuit or as part of an input-output or I/O buffer or cell. In a specific implementation, the integrated circuit is a programmable logic integrated circuit, but in other implementations, the integrated circuit may be another type of integrated circuit. The input buffer may operate as regular TTL buffer or as a Schmitt trigger.

A TTL buffer takes a TTL input signal and translates it into logic levels compatible for the internal circuitry of the chip. For example, these logic levels may be CMOS logic levels; this type of buffer is sometimes referred to as a TTL-to-CMOS buffer. The Schmitt trigger or hysteresis is an option the user can turn on or off. The input buffer circuitry of the invention has a Schmitt trigger option, but without impacting the speed of the input buffer significantly.

This input buffer is designed so when the Schmitt trigger mode is off, the extra devices used in Schmitt trigger mode become part of the regular TTL buffer. These extra devices drive the output loading. As a result, the performance of this input buffer in main speed mode is not impacted by the added feature. Furthermore, the required layout area of the invention is also reduced by sharing the extra devices between input buffer and Schmitt trigger. In a specific implementation of this invention, this circuitry is used as an input buffer to the integrated circuit, but similar circuitry and principles may be applied to internal buffers within the integrated circuit, not necessarily at the input or pins to the integrated circuit.

The FIG. 5 circuitry is merely an example of one specific implementation according to the principles of the invention. There may be many alternate implementations, and the circuitry may be modified to perform the desired function. In FIG. 5, an input signal is provided at IN 501, which is connected to the pin of the integrated circuit. The output of the buffer is provides at OUT 505. For this input buffer the power supplies are separated into a quiet VCC or VCCQ and noisy VCCN. VCCN is typically tied to noisier devices, such as the output drivers. VCCQ is tied to quieter devices or devices were it is important there is not as much noise on the supply line. VCCN and VCCQ may be at the same voltage potential, but may be at different potentials. In an embodiment, VCCN and VCCQ are at different potentials, where VCCN is at about 3.3 volts and VCCQ is at about 1.8 volts.

JTAGOUT is used for output for testing or JTAG purposes. JTAG is an optional feature and the input buffer will be functional without it, although may not be fully JTAG compliant. IE0 and IE1 are option inputs to control the mode the input buffer is operating in. Table A below summarizes the modes of operation.

TABLE A

| IE0 | IE1 | Mode |
| --- | --- | --- |
| 0 | 0 | Standard Buffer. This means the buffer operates as a TTL buffer. |
| 0 | 1 | Schmitt Trigger. This means the buffer operates as a Schmitt trigger, having hysteresis. |
| 1 | 0 | Not Used. |
| 1 | 1 | Not Selected. This means the TTL buffer is disabled and the output of the buffer is always a logic high regardless of the signal at the input pin. |

When NFRZLOGIC is 0, OUT 505 will be a high, regardless of the input and states of IE0 and IE1. This effectively disables the input buffer. For normal operation, NFRZLOGIC will be tied to 1 or VCC, and OUT 505 will be change in response to IN 501. This disable feature is optional. In the case this feature is not needed, NAND gate XG13 may be substituted with an inverter.

When IE0 and IE1 are 00 (which will be referred to as mode 00), the input buffer will operate as a standard TTL buffer. The buffer will transition at a fixed threshold voltage. When IN 501 is high, above the fixed threshold, OUT 505 will be high. When IN 501 is low, below the fixed threshold, OUT 505 will be low. IE0 and IE1 may be implemented using programmable memory or other bits using technologies such as Flash, EEPROM, SRAM, RAM, DRAM, fuse, antifuse, and others. Furthermore, the bits may be stored using a register, flip-flops, or logic gates. The bits may be supplied by user-supplied logic signals, internal or external, or other logic signals, and these may be dynamically changed during operation of the integrated circuit.

For mode 00, NAND gate XG0 will output a high or 1, which is input into an inverted level shifter C6460. HOTSCKT is typically grounded during user mode. HOTSCKT is a signal used for protection purposes. The output of the level shifter C6460 will be a 0, which is an inversion of its input. This means gates of transistors MTIN1, MTNB, and MTIP1 will be grounded. The output of NOR gate XG0SCH will be 0, so transistor MTPS1 will be on. During mode 00, MTNBS3 will also be on.

Level shifter C6460 is optional and may be not included in other embodiments of the invention. When level shifter C6460 is not included, the "not selected" mode (i.e., mode 11) may not be provided or available. The standard buffer and Schmitt trigger options will still be available.

NOR gate XG0SCH will output a low and node ZZE (i.e., gate of transistor MTPS1) will be low and node ZZH (i.e., gate of MTNBS3) will be high. Therefore the circuit branches with MTPS2 and MTNBS4 will be operational during the standard buffer mode, assisting switching node 512 when there are transisions at IN 501.

When IE0 and IE1 are 01 (which will be referred to as mode 01), the input buffer will operate as a Schmitt trigger, where there will be hysteresis. When OUT 505 is low, a gate of transistor MTPS1 will be low, turning it on. The circuit branch with transistors MTPS2 and MTPS1 is enabled to provide hysteresis. A gate of transistor MTNBS3 will be low, turning it off. The circuit branch with transistors MTNBS4 and MTNBS3 will be disabled.

Alternatively, when OUT 505 is high, a high will be at the gate of transistor MTPS1, turning it off. The circuit branch with transistors MTPS1 and MTPS2 will be disabled. A gate of transistor MTNBS3 will be high, turning it on. The circuit branch with transistors MTPS2 and MTPS1 will be enabled, providing hysteresis.

The implementation in FIG. 5 uses CMOS technology, with NMOS and PMOS transistors. In an implementation, the devices used to implement inverter XG1C and transistors MTIN2, MTNI, MTNB, and MTNHS2 may be thick oxide devices. Thick oxide devices are devices with thicker gate oxide than a standard device or transistor. In other implementations, other technologies may be used individual or in combination such as bipolar (i.e., npn and pnp transistors), JFET, gallium arsenide, silicon over insulator, and others.

When IE0 and IE1 are 11, OUT 505 will be a high. Because the output of level shifter C6460 is high, MTIN1 and MTNHS2 will be on.

In operation, the circuit of the invention provides a high-speed buffer that may used at the input of an integrated circuit. In an embodiment, the integrated circuit is a programmable logic device, but in other embodiments, the integrated circuit may be other types of devices such a microprocessors, ASICs, or memories. The buffer may operate as a standard buffer with a single switch threshold or as a Schmitt trigger with hysteresis, having two switching thresholds. One switch threshold is used for a low-to-high input signal and another switch threshold is used for a high-to-low input. Schmitt trigger operation will provide greater noise margins than during standard buffer operation.

The same devices used to facilitate Schmitt trigger operation also are used during switching for the standard buffer. This improves the speed of the device. Specifically devices MTPS2 and MTNBS4 are used during both the standard buffer and Schmitt trigger modes. This speeds up the buffer. MTPS2 and MTNBS4 add loading to node 512. If these devices were used only during Schmitt trigger operation, the loading of MTPS2 and MTNBS4 would slow down the standard buffer operation compared to standard buffer operation when these devices are not present all. However, in the present invention, devices MTPS2 and MTNBS4 assist with switching in both standard buffer and Schmitt trigger mode to improve the transient performance (i.e., reduce propagation delay) of the buffer.

In the buffer of FIG. 5, there are two inversions: a high at the input will mean the output will be high, and a low at the input will mean the output will be low. However, in other implementations, the buffer may have any number of inversions more or less than two. For example, the buffer may have a single inversion, or may have three, four, five, six, or more inversions. There may be an odd number of inversions, which means a high at the input will mean the output will be low, and a low at the input will mean the output will be high.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A circuit comprising:
   a first transistor, coupled between a first node and a first supply voltage, having a control electrode coupled to an input node of the circuit;
   a second transistor coupled between a second supply voltage and the first node;
   a third transistor, coupled between a second node and the first supply voltage, having a control electrode coupled to the input node of the circuit;
   a fourth transistor, coupled between the second supply voltage and the second node, having a control electrode coupled to the input node of the circuit;
   a fifth transistor, coupled between a third node and the first supply voltage, having a control electrode coupled to the second node;
   a sixth transistor, coupled between the second supply voltage and the third node, having a control electrode coupled to the first node, wherein the third node is coupled to a control electrode of the second transistor; and
   a seventh transistor, coupled between a fourth node and the first node, having a control electrode coupled to the third node.

2. The circuit of claim 1 further comprising:
   a ninth transistor, coupled between the fourth node and the second supply voltage, having a control electrode coupled to fifth node; and
   a logic gate having inputs coupled to an output node of the circuit and a mode control bit, and an output of the logic gate is coupled to the fifth node.

3. The circuit of claim 1 further comprising:
an eighth transistor, coupled between the first node and a fifth node, having a control electrode coupled to the input node of the circuit.

4. The circuit of claim 1 further comprising:
an eighth transistor, coupled between the first node and a fifth node, having a control electrode coupled to the input node of the circuit;
a ninth transistor, coupled between the fifth node and the first supply voltage, having a control electrode coupled to a sixth node; and
a logic gate having inputs coupled to an output node of the circuit and a mode control bit, and an output of the logic gate is coupled to the sixth node.

5. The circuit of claim 2 wherein when the mode control bit is in a first state, the circuit is in a standard buffer mode, and when the mode control bit is in a second state, the circuit is in a Schmitt trigger mode, and the ninth transistor may be on when the mode control bit is in the first or the second state.

6. The circuit of claim 4 wherein when the mode control bit is in a first state, the circuit is in a standard buffer mode, and when the mode control bit is in a second state, the circuit is in a Schmitt trigger mode, and the ninth transistor may be on when the mode control bit is in the first or the second state.

7. The circuit of claim 1 wherein a signal at an output node of the circuit is inverted with respect to a signal at the first node.

8. A programmable logic integrated circuit comprising a circuit as recited in claim 1.

9. An electronic system comprising a circuit as recited in claim 1.

10. The circuit of claim 1 further comprising:
an eighth transistor, coupled between the second supply voltage and the supply voltage, having a control electrode coupled to the second node.

11. The circuit of claim 10 wherein the eighth transistor is turned off when a mode control bit indicates the circuit is in a standard buffer mode.

12. The circuit of claim 2 wherein the mode control bit is stored using at least one of the following RAM, SRAM, flip flop, register, Flash, EEPROM, EPROM, fuse, or anti-fuse.

13. The circuit of claim 2 wherein there are a plurality of mode control bits to indicate an operational mode of the circuit.

14. A circuit comprising:
a first transistor, coupled between a first node and a first supply voltage, having a control electrode coupled to an input node of the circuit;
a second transistor coupled between a second supply voltage and the first node;
a third transistor, coupled between a second node and the first supply voltage, having a control electrode coupled to the input node of the circuit;
a fourth transistor, coupled between a third supply voltage and the second node, having a control electrode coupled to the input node of the circuit, wherein the third supply voltage is different from the second supply voltage;
a fifth transistor, coupled between a third node and the first supply voltage, having a control electrode coupled to the second node;
a sixth transistor, coupled between the second supply voltage and the third node, having a control electrode coupled to the first node, wherein the third node is coupled to a control electrode of the second transistor; and
a seventh transistor, coupled between a fourth node and the first node, having a control electrode coupled to the third node.

15. A method of operating a programmable logic integrated circuit comprising:
providing an input buffer capable of operating as a standard buffer in a first mode or a Schmitt trigger in a second mode;
configuring a mode bit to control whether the input buffer operates in the first mode or the second mode;
when in the first mode, using a transistor to couple a supply voltage to a first node of the input buffer depending on a input signal to the input buffer; and
when in the second mode, using a transistor to couple the supply voltage to the first node of the input buffer depending on the input signal to the input buffer and an output signal of the input buffer.

16. The method of claim 15 wherein when in the first mode, the input buffer has one switching threshold, and when in the second mode, the input buffer has a two switching thresholds.

17. The method of claim 15 wherein the mode bit may be changed dynamically during the operation of the programmable logic integrated circuit.

* * * * *